US012588322B2

(12) United States Patent
Lo et al.

(10) Patent No.: US 12,588,322 B2
(45) Date of Patent: Mar. 24, 2026

(54) MICRO LIGHT-EMITTING DIODE STRUCTURE AND DISPLAY PANEL DEVICE

(71) Applicant: PlayNitride Display Co., Ltd., Zhunan Township (TW)

(72) Inventors: Yu-Yun Lo, Zhunan Township, Miaoli County (TW); Bo-Wei Wu, Zhunan Township, Miaoli County (TW); Kuo-Wei Chen, Zhunan Township, Miaoli County (TW); Shih-Yao Liang, Zhunan Township, Miaoli County (TW)

(73) Assignee: PlayNitride Display Co., Ltd., Zhunan Township (TW)

( * ) Notice: Subject to any disclaimer, the term of this patent is extended or adjusted under 35 U.S.C. 154(b) by 399 days.

(21) Appl. No.: 18/323,601

(22) Filed: May 25, 2023

(65) Prior Publication Data

US 2024/0347673 A1 Oct. 17, 2024

(30) Foreign Application Priority Data

Apr. 17, 2023 (TW) .................................. 112114255

(51) Int. Cl.
*H10H 20/824* (2025.01)
*H10H 20/851* (2025.01)
*H10W 90/00* (2026.01)

(52) U.S. Cl.
CPC .... *H10H 20/8242* (2025.01); *H10H 20/8512* (2025.01); *H10W 90/00* (2026.01)

(58) Field of Classification Search
CPC ............................. H10H 20/80; H10H 20/819
See application file for complete search history.

(56) References Cited

U.S. PATENT DOCUMENTS

2011/0024781 A1* 2/2011 Fujimoto ............. H10H 20/831
257/98

* cited by examiner

*Primary Examiner* — Matthew L Reames
(74) *Attorney, Agent, or Firm* — MUNCY, GEISSLER, OLDS & LOWE, P.C.

(57) ABSTRACT

A micro light-emitting diode structure includes a first-type semiconductor layer, a light-emitting layer, a second-type semiconductor layer, and a base layer stacked with each other. A width of the light-emitting layer is greater than that of the first-type semiconductor layer and that of the second-type semiconductor layer. A width of the base layer is at least greater than that of the second-type semiconductor layer. A manufacturing method of the micro light-emitting diode structure by mixing dry etching and wet etching. The manufacturing method not only reduces the time that the semiconductor layers are in contact with the etching solution in the wet etching process to increase the etching stability, but avoids the dangling bond effect on the sidewall caused by the dry etching. Therefore, a combination of the advantages of the two etchings further increases the external quantum efficiency.

14 Claims, 7 Drawing Sheets

100
140
120
130
110
SL'
150

140
14
100
120
130
110
SL'
150

140
14
100
120
130
110
SL'
150

MICRO LIGHT-EMITTING DIODE STRUCTURE AND DISPLAY PANEL DEVICE

CROSS-REFERENCE TO RELATED APPLICATIONS

This application is based upon and claims priority under 35 U.S.C. 119 from Taiwan Patent Application No. 112114255 filed on Apr. 17, 2023, which is hereby specifically incorporated herein by this reference thereto.

BACKGROUND OF THE INVENTION

1. Field of the Invention

The present invention relates to a light-emitting diode structure, more particularly to a micro light-emitting diode structure and display panel device.

2. Description of the Prior Arts

In a manufacturing process of a conventional micro light-emitting device, an epitaxial wafer is usually divided into a plurality of micro light-emitting diode structures by dry etching or wet etching. The dry etching process is to use plasma of reactive ions to etch the epitaxial wafer, which is an anisotropic etching. The wet etching is to etch the epitaxial wafer via chemical etching solution, which is an isotropic etching.

An advantage of the dry etching is that the size of divided micro light-emitting diode structures is easy to approach the preset size. However, the dry etching damages the molecular structure of the micro light-emitting diode structure and causes a part of atoms located on a sidewall to lose bonding object, in which dangling bonds are generated. The dangling bonds have extremely high activity and are easy to bond with the oxygen atoms in the air. Therefore, when the micro light-emitting diode structure is driven, the dangling bonds increase an SRH (Schottky-Read-Hall) non-radiative recombination of electron-hole pairs in a light-emitting layer. An external quantum efficiency decreases because of the dangling bonds causing a reduction of a light-emitting efficiency. At the same time, the dry etching also damages a sidewall of other layers and affects the electrical performances of the light-emitting diode structure including a current leakage or other problems caused thereby.

On the other hand, although the wet etching prevents the micro light-emitting diode structure from the aforementioned non-radiative recombination problem, a stability of the manufacturing process is relatively low. Furthermore, since the wet etching is the isotropic etching, a plane size of the micro light-emitting diode structure is reduced too much because of an over-etching. Thus, the plane size is difficult to be controlled to consist of a preset patterning size.

With the foregoing description, regardless of whether the dry etching or the wet etching is applied, various problems in the micro light-emitting diode structure are caused. Thus, the micro light-emitting diode structure needs to be improved.

SUMMARY OF THE INVENTION

An objective of the present invention is to provide a micro light-emitting diode structure and display panel device.

To achieve the objection as mentioned above, the micro light-emitting diode structure includes:

a first-type semiconductor layer having a first width on a cross-section of the micro light-emitting diode structure;

a second-type semiconductor layer disposed on a side of the first-type semiconductor layer and having a second width on the cross-section of the micro light-emitting diode structure;

a light-emitting layer disposed between the first-type semiconductor layer and the second-type semiconductor layer and having a third width greater than the first width and the second width on the cross-section of the micro light-emitting diode structure; and a base layer disposed on a side of the second-type semiconductor layer away from the first-type semiconductor layer and having a fourth width greater than the second width.

In the micro light-emitting diode structure of the present invention, the fourth width of the base layer is at least greater than the second width of the second-type semiconductor layer. Such structural relationship is mainly formed by dividing out the base layer by dry etching, and then the second-type semiconductor layer, the light-emitting layer, and the first-type semiconductor layer are sequentially formed by wet etching. Accordingly, since the base layer is divided out by the dry etching at first, adverse effects of each layer caused by a long-time wet etching to the whole micro light-emitting diode structure are reduced. Furthermore, the wet etching provides a condition for the reconstruction of the molecular structure on a surface of a sidewall through reacting and rebinding. Therefore, the dangling bonds caused by the dry etching are reduced, and the external quantum efficiency of the micro light-emitting diode structure is improved.

To achieve the objection as mentioned above, the display panel device includes: a driving carrier and a plurality of the micro light-emitting diode structures as mentioned above; wherein the micro light-emitting diode structures are electrically connected to the driving carrier and are driven by the driving carrier.

In the display panel device of the present invention, the plurality of the micro light-emitting diode structures as mentioned above are electrically connected to the driving carrier. Each micro light-emitting diode structure has advantages of the combination of the dry etching and the wet etching. Thus, the external quantum efficiency is increased to improve an overall light-emitting efficiency of the display panel device as the micro light-emitting diode structures are driven by the driving carrier.

DETAILED DESCRIPTION OF THE EMBODIMENTS

With multiple embodiments and drawings thereof, the features of the present invention are described in detail as follows.

Figure 1:
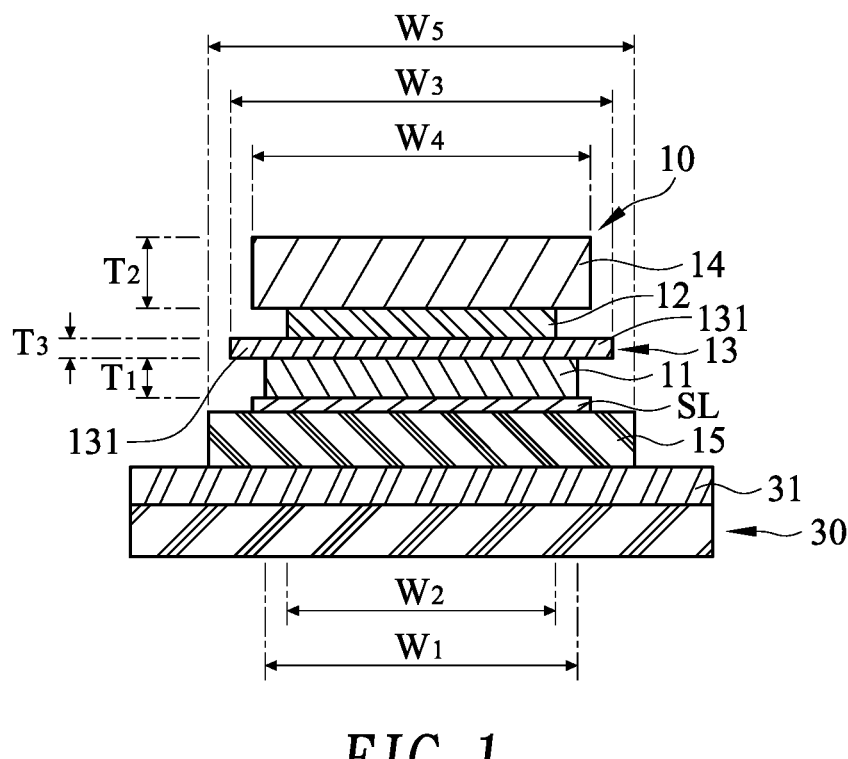
FIG. 1 is a cross-sectional view of a micro light-emitting diode structure in accordance with the present invention.

With reference to FIG. 1, a micro light-emitting diode structure 10 of the present invention is shown. The micro light-emitting diode structure 10 is disposed on a carrier 30 and mainly includes a base layer 14, a second-type semiconductor layer 12, a light-emitting layer 13, and a first-type semiconductor layer 11 from top to bottom. In the present embodiment, the micro light-emitting diode structure 10 may further include a window layer 15 stacked on a side of the first-type semiconductor layer 11 away from the second-type semiconductor layer 12. Furthermore, the micro light-emitting diode structure 10 may further include a space layer SL derived during an epitaxy process and stacked between the first-type semiconductor layer 11 and the window layer 15.

The micro light-emitting diode structure 10 is divided out from an epitaxial wafer by steps (a) to (h) introduced as follows.

Figure 2A:
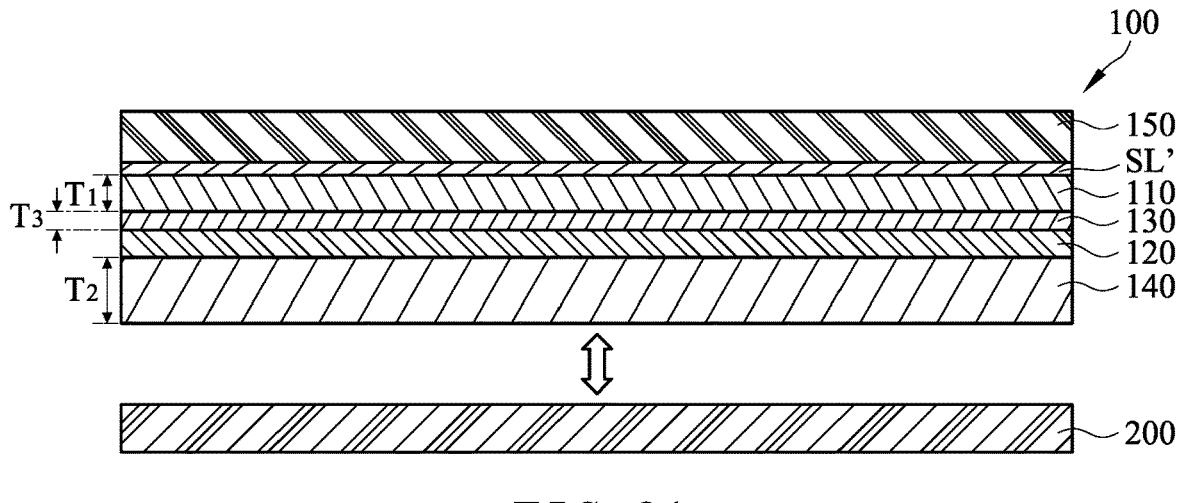
FIGS. 2A to 2I are cross-sectional views of the micro light-emitting diode structure in different steps of a manufacturing process in accordance with the present invention.

In the step (a), as shown in FIG. 2A, an epitaxial wafer 100 manufactured by an epitaxy process includes a base layer 140, a second-type semiconductor layer 120, a light-emitting layer 130, a first-type semiconductor layer 110, a space layer SL', and a window layer 150 from bottom to top. In the step (a), the epitaxial wafer 100 is separated from a first carrier 200. In the present embodiment, the first carrier 200 generally refers to an epitaxial growth substrate of the epitaxial wafer 100. The epitaxial wafer 100 may be separated from the first carrier 200 by, for example, laser vaporizing a part of the base layer 140. In the present embodiment, the epitaxial wafer 100 may be manufactured by a red color light-emitting diode epitaxy process and May be a multi-component compound made of an aluminum indium phosphide (AlInP) material. Specifically, the base layer 140 may include more materials. For example, the material of the base layer 140 may include an aluminum gallium indium phosphide (AlGaInP) material but is not limited thereto. To make the base layer 140 conductive, the base layer 140 may include an N-type doped aluminum gallium indium phosphide (N-AlGaInP) material. The second-type semiconductor layer 120 may include the aluminum indium phosphide (AlInP) material. Specifically, the second-type semiconductor layer 120 may include an N-type doped aluminum indium phosphide (N-AlInP) material. Thus, the second-type semiconductor layer 120 may be an N-type cladding layer, but is not limited thereto. A material of the light-emitting layer 130 may be the same as the material of the base layer 140, and the light-emitting layer 130 may be a multi-quantum well layer. The first-type semiconductor layer 110 may include the aluminum indium phosphide (AlInP) material. Specifically, the first-type semiconductor layer 110 may include a P-type doped aluminum indium phosphide (P-AlInP) material. Thus, the first-type semiconductor layer 110 may be a P-type cladding layer, but is not limited thereto. A content of the gallium in the first-type semiconductor layers 110 and a content of the gallium in the second-type semiconductor layers 120 are much lower than a content of the gallium in the light-emitting layer 130 or the base layer 140. In another case, the first-type semiconductor 110 layer and the second-type semiconductor layer 120 may be gallium-free. Specifically, the content of the gallium means a concentration of the gallium, i.e., a number of atoms of the gallium in a unit volume. The window layer 150 may include a gallium phosphide (GaP) material. The space layer SL' may include a P-type doped aluminum gallium indium phosphide (P-AlGaInP) material and may be treated as a lattice-constant transition layer for the growth of the epitaxial wafer 100. However, it should be understood that the composition of materials of the epitaxial wafer 100 may be various, and the variety in the materials does not affect the implementation of the present invention.

Figure 2B:
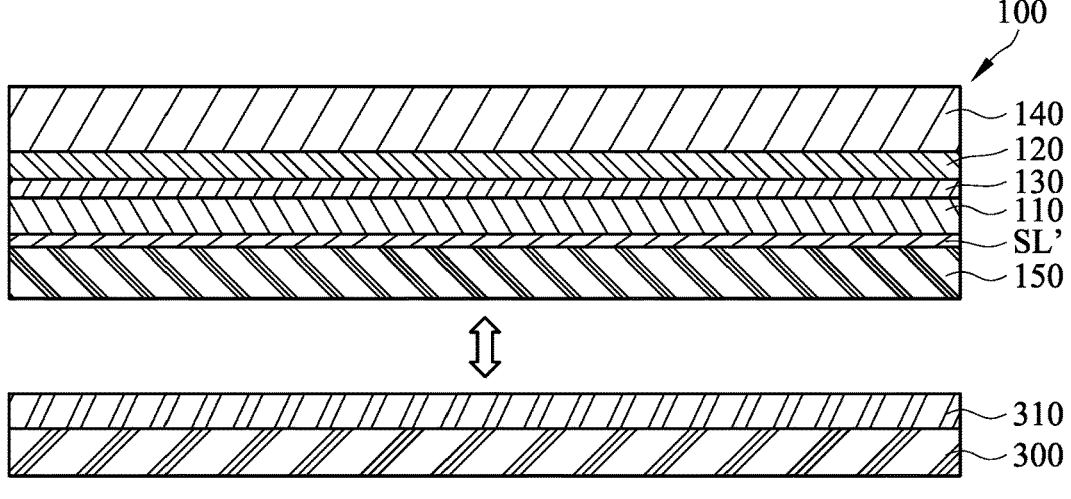
Figure 2C:
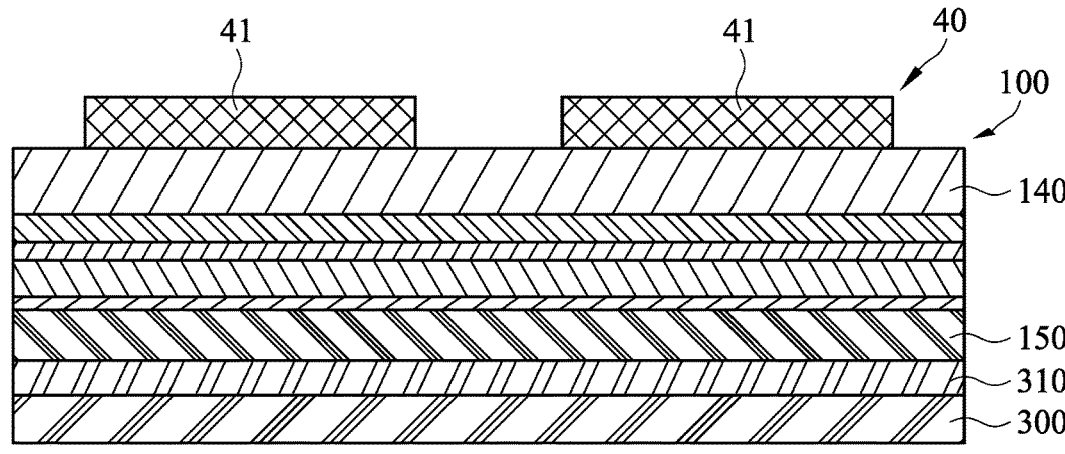

In the step (b), as shown in FIG. 2B, the epitaxial wafer 100 in the step (a) is flipped to be upside down and transferred to a second carrier 300. In one embodiment, the second carrier 300 may be a temporary carrier without circuit. Therefore, an adhesive layer 310 may first be coated on the second carrier 300, and thereafter, as shown in FIG. 2C, the window layer 150 of the epitaxial wafer 100 facing toward the adhesive layer 310 is adhered to the second carrier 300. However, depending on an actual situation, the step (b) may be unnecessary. For example, in another embodiment, the following steps may be directly carried out in a situation that the epitaxial wafer 100 without being flipped and without being separated from the first carrier 200. In another condition, based on another requirement of the manufacturing process, the step (b) may be carried out twice or more. In this way, the second carrier 300 may be disposed on different sides of the epitaxial wafer 100.

In the step (c), as shown in FIG. 2C, a first photoresist layer 40 is coated on the upmost base layer 140 of the epitaxial wafer 100. Then, an exposure and a development of the first photoresist layer 40 are carried out, so as a first mask pattern 41 is formed on the base layer 140.

Figure 2D:
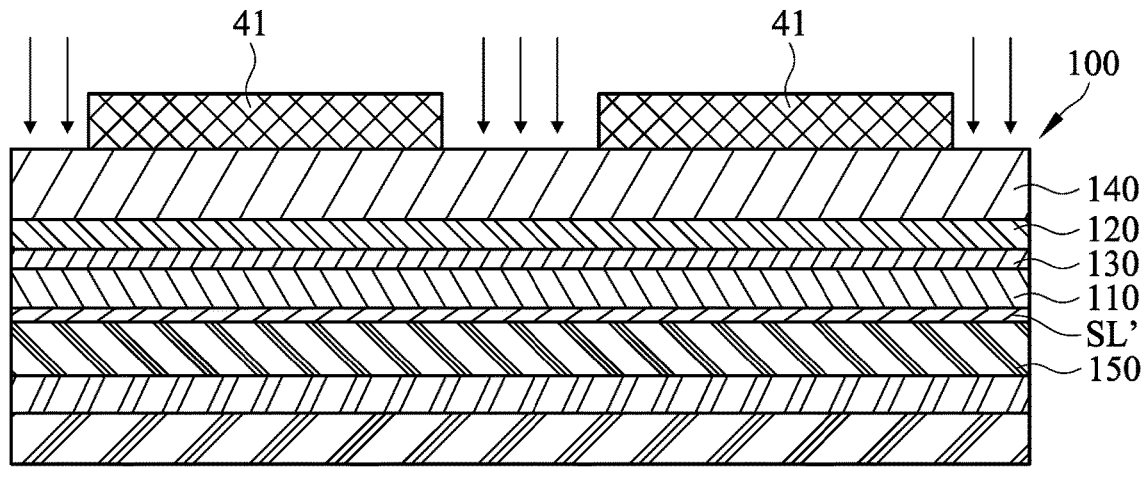
Figure 2E:
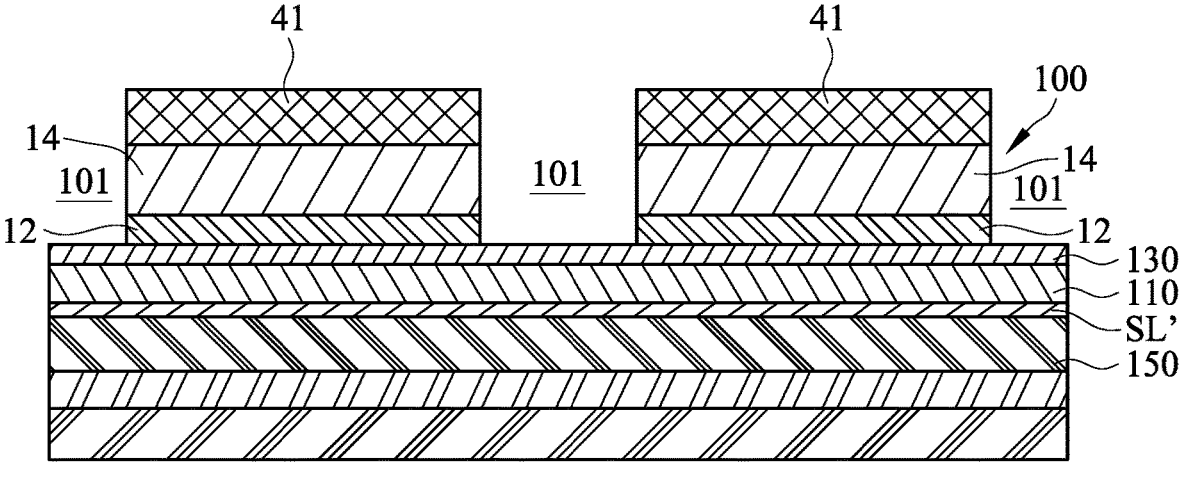
Figure 3A:
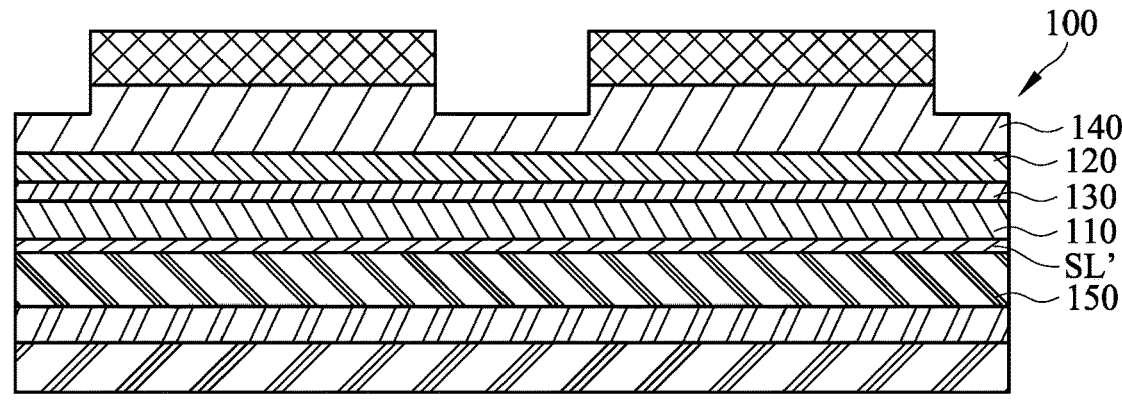
FIGS. 3A to 3C are cross-sectional views of the micro light-emitting diode structure in different etching depths after a dry etching step in FIG. 2C.
Figure 3B:
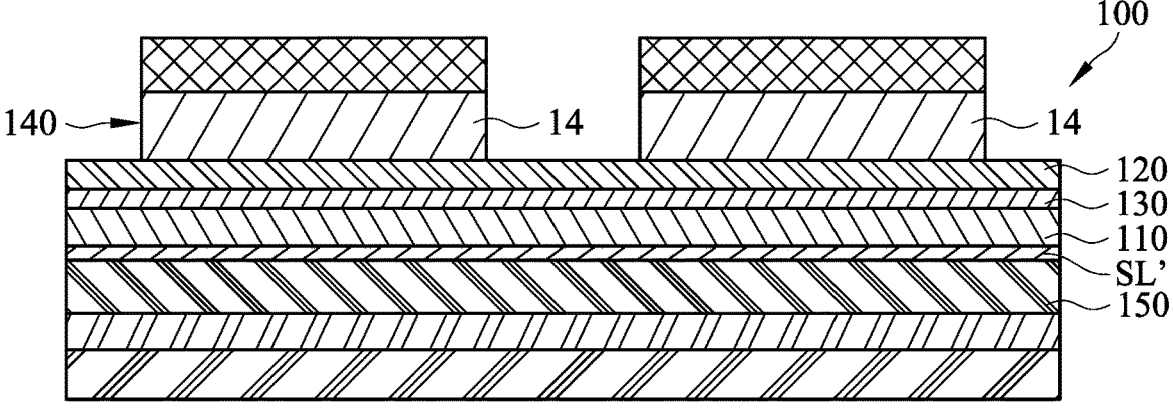

In the step (d), as shown in FIG. 2D, the epitaxial wafer 100 is etched by the dry etching under the first mask pattern 41 is used as a mask. Here, unmasked parts of the epitaxial wafer 100 is etched down by the dry etching. Specifically, as shown in FIGS. 2D and 2E, the base layer 140 and the second-type semiconductor layer 120 of the epitaxial wafer 100 are etched down by the dry etching until reaching a depth where a part of a top surface of the light-emitting layer 130 is exposed. A plurality of etching regions 101 are formed, and the base layer 140 and the second-type semiconductor layer 120 are divided into a plurality of base layers 14 and a plurality of second-type semiconductor layers 12 separated from each other, respectively. In other embodiments, the epitaxial wafer 100 may be etched down by the dry etching until reaching a depth where the top surface of the light-emitting layer 130 is not exposed. For example, as shown in FIG. 3A, the epitaxial wafer 100 may be etched down by the dry etching until only a part of the thickness of the base layer 140. Alternatively, as shown in FIG. 3B, the epitaxial wafer 100 may be etched down by the dry etching until a depth where a top surface of the second-type semiconductor layer 120 is exposed. In a further example shown in FIG. 3C, the epitaxial wafer 100 may be etched through the base layer 140 by the dry etching further reaching a part of the second-type semiconductor layer 120.

Figure 2F:
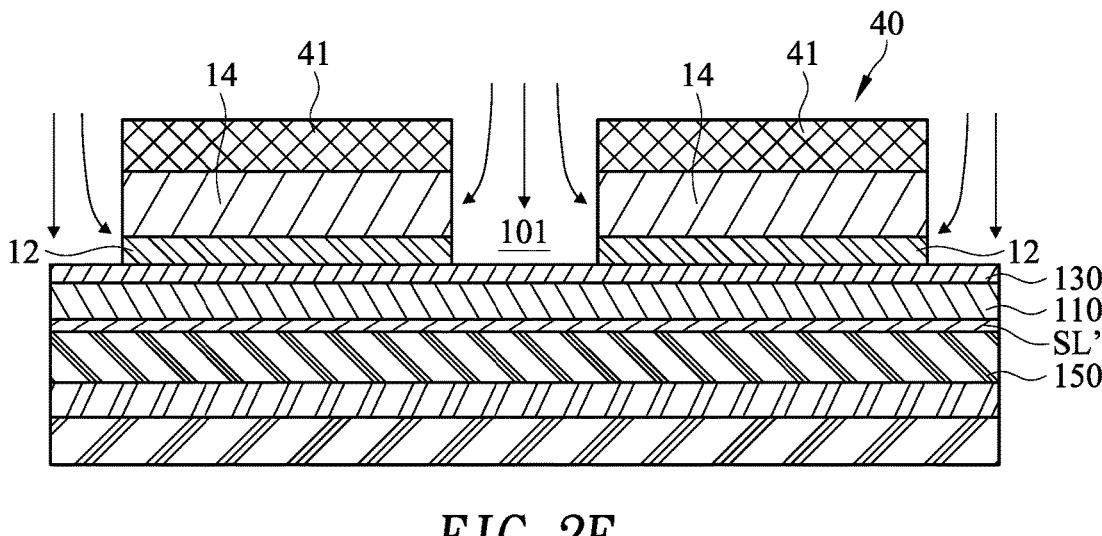
Figure 2G:
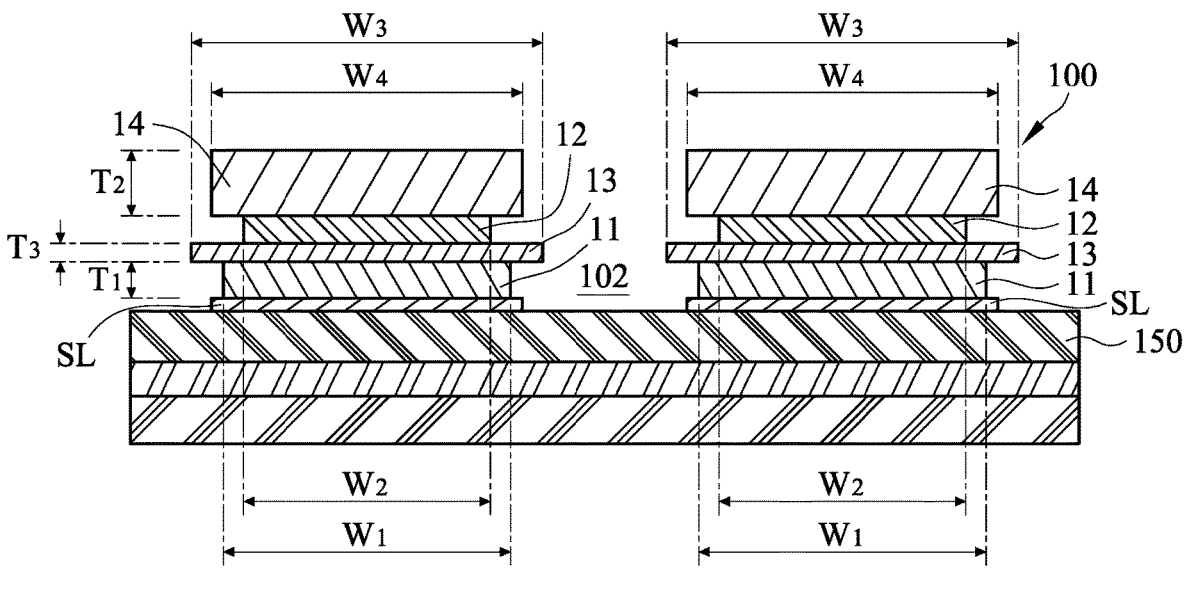

In the step (e), as shown in FIGS. 2F and 2G, the epitaxial wafer 100 is further etched down by the wet etching with the first mask pattern 41 which is also used as an etching mask. The light-emitting layer 130, the first-type semiconductor layer 110, and the space layer SL' are etched down by the wet etching along the etching region 101 until a top surface of the window layer 150 is exposed after an etching solution is applied. Thus, the light-emitting layer 130, the first-type semiconductor layer 110 and the space layer SL' are divided into a plurality of light-emitting layers 13, a plurality of first-type semiconductor layers 11 and a plurality of space layers SL separated from each other, respectively. Furthermore, the etching solution applied in the present embodiment may have characteristics as follows. The etching solution has a high selectivity to the materials of the first-type semiconductor layer 110 and the second-type semiconductor layer 120 as shown in FIG. 2A and has a low selectivity to the materials of the light-emitting layer 130, the base layer 140, the space layer SL', and the window layer 150. Therefore, after the wet etching shown in FIG. 2D is completed, the structure of the epitaxial wafer 100 is shown in FIG. 2G. In FIG. 2G, a second width W2 of each second-type semiconductor layer 12 and a first width W1 of each first-type semiconductor layer 11 are smaller than a third width W3 of the corresponding light-emitting layer 13, a fourth width W4 of the corresponding base layer 14, and a width of the corresponding space layer SL. The window layer 150 is an end of the wet etching, so it is not etched by the wet etching. Furthermore, the first width W1 of the first-type semiconductor layer 11 and the second width W2 of the second-type semiconductor layer 12 may be greater than or equal to 70%, and preferably above 80% of the third width W3 of the light-emitting layer 13. Moreover, it is revealed by the relative position of the layers in FIG. 2G that the second-type semiconductor layer 120 contacts the etching solution earlier than the first-type semiconductor layer 110 does. Thus, the second width W2 of each second-type semiconductor layer 120 is smaller than the corresponding first width W1 of the first-type semiconductor layer 110. Similarly, since each base layer 14 is etched by the dry etching and wet etching sequentially, the fourth width W4 of each base layer 14 is smaller than the third width W3 of the corresponding light-emitting layer 13. In other words, the fourth width W4 of the base layer 14 is between the first width W1 of the first-type semiconductor layer 11 and the third width W3 of the light-emitting layer 13. Additionally, with reference to FIG. 1, the light-emitting layer 13 may have an extended part 131 laterally protruding from a peripheral side of the light-emitting layer 13 relative to the first-type semiconductor layer 110 and the second-type semiconductor layer 12. The extended part 131 exposes a part of an upper surface and a part of a lower surface of the light-emitting layer 13. The light emitted from the extended part 131 that laterally protrudes is not absorbed by the first-type semiconductor layer 11 and the second-type semiconductor layers 12. Accordingly, the light-extraction efficiency of the light-emitting layer is effectively increased, and a light-emitting efficiency of the micro light-emitting diode structure is further improved.

Figure 3C:
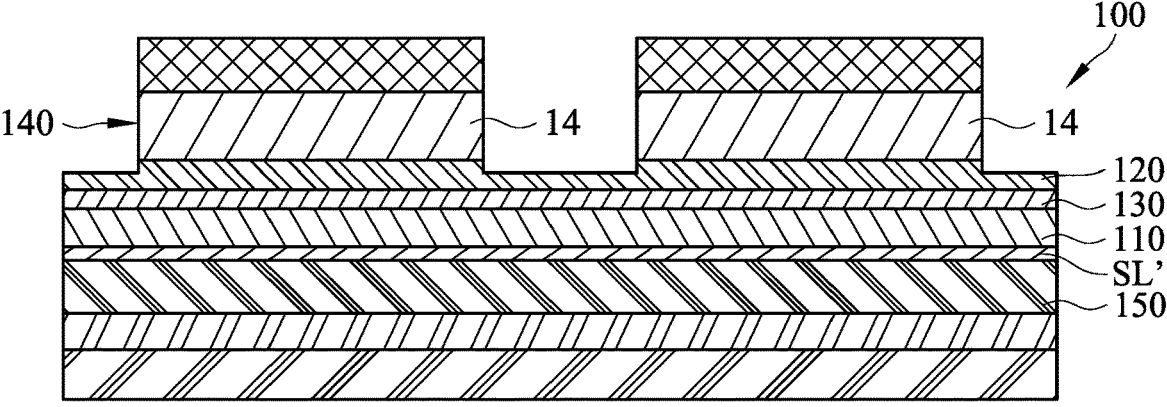

Additionally, since the second-type semiconductor layer 12 contacts with the etching solution earlier than the first-type semiconductor layer 11 and the light-emitting layer 13 do, to prevent excessive reduction of the second width W2 of the second-type semiconductor layer 12 due to the long etching time in the wet etching, the first-type semiconductor layer 11 and the light-emitting layer 13 may have thinner first thickness T1 and third thickness T3 respectively. For example, in one embodiment, a sum of the first thickness T1 of the first-type semiconductor layer 11 and the third thickness T3 of the light-emitting layer 13 may preferably be smaller than a second thickness T2 of the base layer 14. In another embodiment, the sum of the thicknesses mentioned here may be smaller than a thickness of the second-type semiconductor layer 12. Namely, in an epitaxial process, the first-type semiconductor layer 11 may be farther from the epitaxial growth substrate and have a smaller thickness than the second-type semiconductor layer 12, so as to decrease the etching time in the wet etching for the first-type semiconductor layer 11. Furthermore, as shown in FIGS. 3A and 3C, based on the different depths of dry etching selected in the manufacturing process, the final fourth width W4 and the final second width W2 may be varied after the wet etching is completed. In other words, the depth of the dry etching directly affects an exposure time of each layer in the wet etching. Since the wet etching has an isotropic etching characteristic, the width of each layer may be varied according to the different exposure times. In a case that the epitaxial wafer 100 is manufactured by a red color light-emitting diode epitaxy process, the etching solution may be a mixture solution of a hydrochloric acid and a phosphoric acid. The etching solution reacts with the aluminum (Al) and the indium (In) and does not react with the gallium (Ga). Namely, the etching solution has a high selectivity to the material (such as the aluminum indium phosphate, AlInP) of the first-type semiconductor layer 110 and the second-type semiconductor layer 120, but has a low selectivity to the material (such as the aluminum gallium indium phosphate, AlGaInP) of the light-emitting layer 130, the base layer 140, and the space layer SL', and has almost no selectivity to the material (such as the gallium phosphate, GaP) of the window layer 150.

In the step (f), as shown in FIGS. 2F and 2G, the first photoresist layer 40 is removed.

Figure 2H:
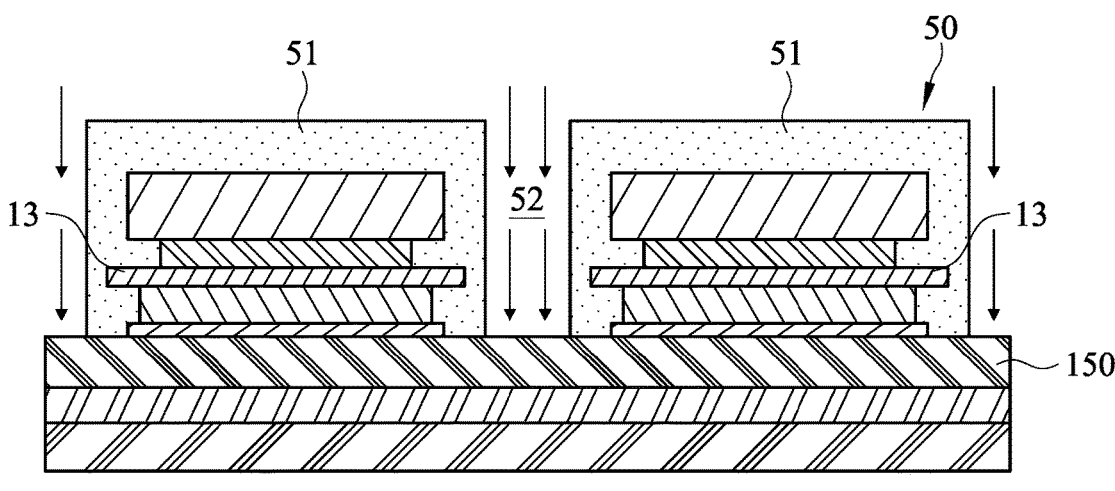

In the step (g), as shown in FIG. 2H, a second photoresist layer 50 is first coated on the epitaxial wafer 100, and afterwards an exposure and a development of the second photoresist layer 50 are carried out to form a second mask pattern 51 corresponding to the etching spaces 102 as shown in FIG. 2G, therefore a plurality of etching regions 52 are formed on the window layer 150.

Figure 2I:
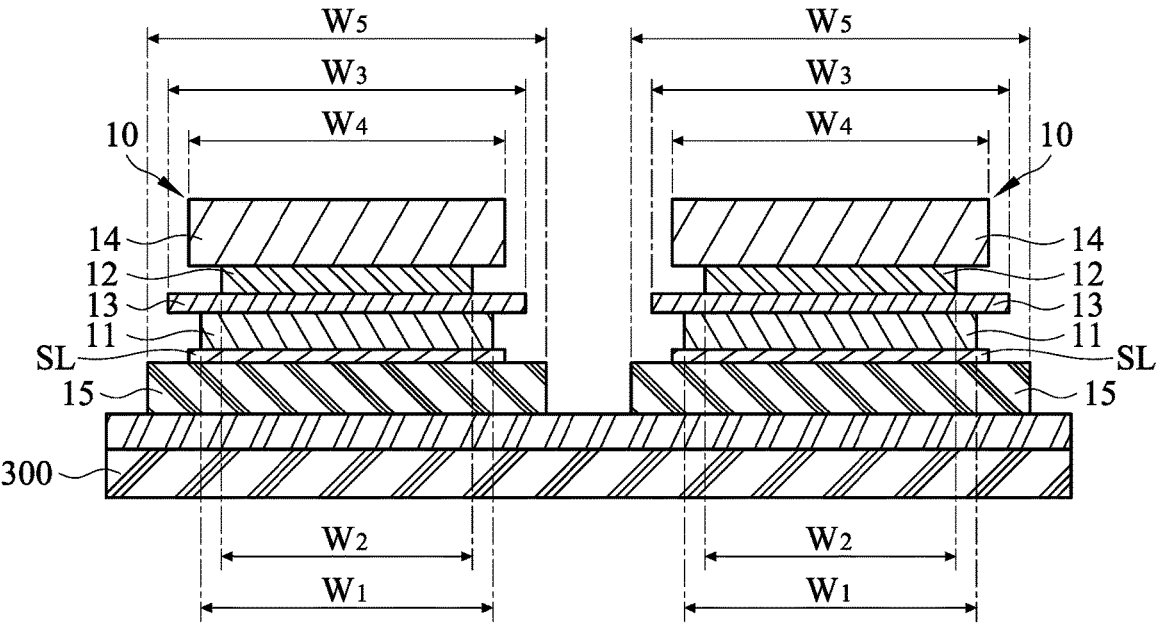

In the step (h), as shown in FIGS. 2H and 2I, a part of the window layer 150 unmasked by the second mask pattern 51 is etched down by the dry etching and divided into a plurality of window layers 15 separated from each other. In the present embodiment, the second mask pattern 51 completely covers a region outside the sidewall of the light-emitting layer 13. Moreover, since the dry etching is an anisotropic etching, each window layer 15 divided out by the dry etching has a fifth width W5 greater than the fourth width W4 of the base layer 14, the second layer W2 of the second-type semiconductor layer 12, the third width W3 of the light-emitting layer 13, and the first width W1 of the first-type semiconductor layer 11.

With reference to FIGS. 2H and 2I, in the step (g), the second photoresist layer 50 is removed to form a plurality of the micro light-emitting diode structures 10.

Figure 4:
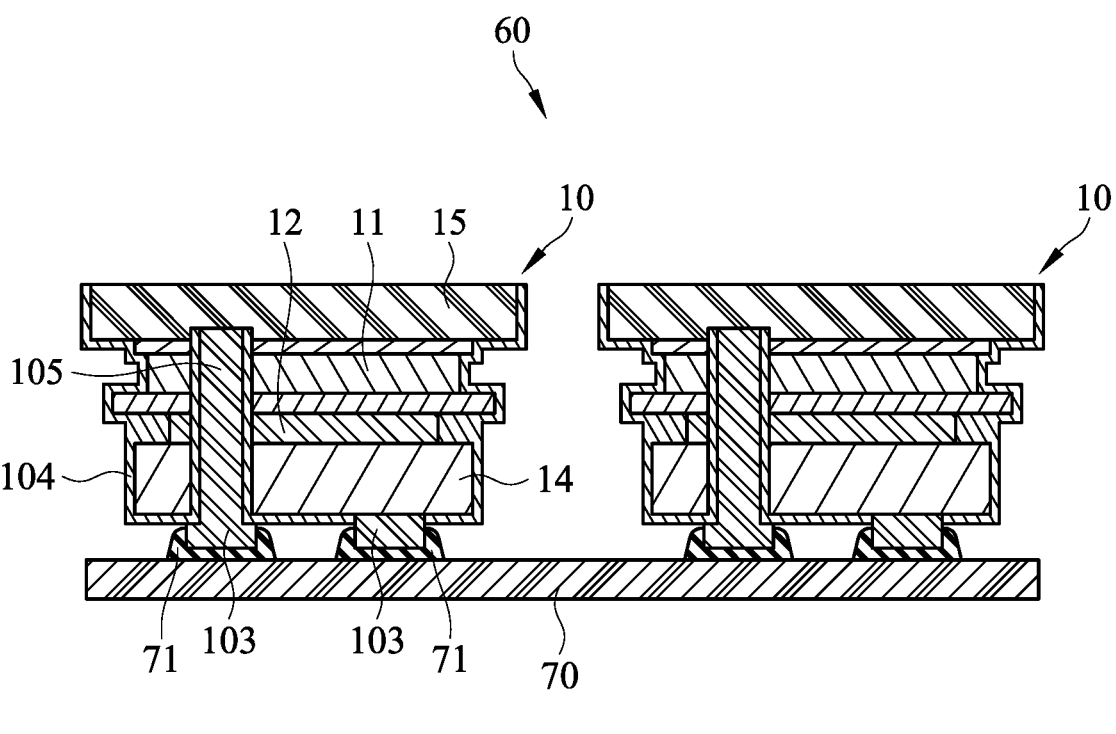
FIG. 4 is a schematic view of an embodiment of a display panel device in accordance with the present invention.

With reference to FIGS. 2I and 4, schematic views of an embodiment of a display panel device 60 in accordance with the present invention are shown. After a patterning etching process as shown in FIG. 2I is finished and the micro light-emitting diode structures 10 are obtained, two electrodes 103 and an insulation layer 104 may be deposited on a surface of each micro light-emitting diode structure 10. The window layer 15 and the base layer 14 may respectively be doped and thus be conductive semiconductor layers. The electrodes 103 are disposed on a side of the base layer 14 and are respectively connected to the window layer 15 and the base layer 14, so as ohmic contact is formed between the first-type semiconductor layer 11 and the second-type semiconductor layer 12. One of the electrodes 103 may be connected to the window layer 15 through a conductive via 105 as shown in FIG. 4. However, the way of the ohmic contact between the first-type semiconductor layer 11 and the second-type semiconductor layer 12 is not limited to the exemplification here.

With the foregoing description, the second carrier 300 may be the temporary carrier without the circuit. As shown in FIG. 4, in the present embodiment, the micro light-emitting diode structures 10 are further transferred to a driving carrier 70. The driving carrier 70 has a plurality of pads 71 respectively located on each bonding position for electrically connecting to, and whereby driving and controlling the micro light-emitting diode structures 10. In FIG. 4, the orientation of each micro light-emitting diode structure 10 is upside down compared to FIG. 2I, and the second carrier 300 is removed (for example, being removed by vaporizing the adhesive layer 310.) after completely transferring. Additionally, a side of the base layer 14 away from the second semiconductor layer 12 of each micro light-emitting diode structure 10 faces toward the driving carrier 70. It should be noted that, based on different process selections, the electrodes 103 may not always be located on the side of the base layer 14, therefore the orientation relationship described here does not constitute a limitation to the present embodiment.

With the foregoing description, in the micro light-emitting diode structure of the present invention, the base layer is first divided out by the dry etching, then the base layer is etched by the wet etching to divided out the second-type semiconductor layer, the light-emitting layer, and the first-type semiconductor layer. Therefore, the fourth width of the base layer is at least greater than the second width of the second-type semiconductor layer. Since the base layer is formed by the dry etching beforehand, in the subsequent wet etching the time that the base layer, the second-type semiconductor layer, and the light-emitting layer contact the etching solution is short. Thus, it is prevented that the size of the second-type semiconductor layer, the light-emitting layer, and the first-type semiconductor layer disposed under the base layer shrink too much caused by over-etching, and the size of the micro light-emitting diode structure is easy to be controlled to consist of the preset size. Furthermore, since the epitaxial wafer is still patterning defined by the wet etching after the dry etching, the sidewall of each micro light-emitting diode structure undergoes a reaction through the wet etching. This makes the dangling bonds on the sidewall of each layer during the dry etching process are reduced, so the external quantum efficiency of the micro light-emitting diode structure is further improved. Therefore, through combining the dry etching and the wet etching in the pattern manufacturing process, the present invention has both advantages of the stability of the dry etching and the effect of eliminating the dangling bonds by the wet etching, and the disadvantages of the dry etching and the wet etching are both avoided.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A micro light-emitting diode structure comprising:
   a first-type semiconductor layer having a first width on a cross-section of the micro light-emitting diode structure;
   a second-type semiconductor layer disposed on a side of the first-type semiconductor layer and having a second width on the cross-section of the micro light-emitting diode structure;
   a light-emitting layer disposed between the first-type semiconductor layer and the second-type semiconductor layer and having
      an extended part laterally protruding from at least two sides of the light-emitting layer relative to the first-type semiconductor layer and the second-type semiconductor layer, and the extended part exposes a part of an upper surface and a part of an underside surface of the light-emitting layer; and
      a third width greater than the first width and the second width on the cross-section of the micro light-emitting diode structure; and
   a base layer disposed on a side of the second-type semiconductor layer away from the first-type semiconductor layer and having a fourth width greater than the second width.

2. The micro light-emitting diode structure as claimed in claim 1, further comprising a carrier, wherein a side of the first-type semiconductor layer away from the base layer is disposed on the carrier, and the second width is smaller than the first width.

3. The micro light-emitting diode structure as claimed in claim 1, wherein the first-type semiconductor layer is a P-type cladding layer, the second-type semiconductor layer is an N-type cladding layer, and the first width is smaller than the fourth width.

4. The micro light-emitting diode structure as claimed in claim 1, wherein a width of the second-type semiconductor layer or a width of the base layer has a variation on the cross-section of the micro light-emitting diode structure.

5. The micro light-emitting diode structure as claimed in claim 1, wherein the light-emitting layer includes an aluminum gallium indium phosphide (AlGaInP) material, and a color of a light emitted from the light-emitting layer is red.

6. The micro light-emitting diode structure as claimed in claim 5, wherein
   both the first-type semiconductor layer and the second-type semiconductor layer include gallium; and
   a content of the gallium in the light-emitting layer is higher than a content of the gallium in the first-type semiconductor layer and the second-type semiconductor layer.

7. The micro light-emitting diode structure as claimed in claim 3, wherein both the base layer and the second-type semiconductor layer include gallium, and a content of the gallium in the base layer is higher than a content of the gallium second-type semiconductor layer, and the fourth width is between the first width and the third width.

8. The micro light-emitting diode structure as claimed in claim 7, wherein the light-emitting layer and the base layer are made of the same material.

9. The micro light-emitting diode structure as claimed in claim 1 further comprising a window layer disposed on a side of the first-type semiconductor layer away from the base layer and having a fifth width greater than the first width, the second width, the third width, and the fourth width on the cross-section of the micro light-emitting diode structure.

10. The micro light-emitting diode structure as claimed in claim 1, wherein the first width and the second width are less than the third width, but greater than or equal to 70% of the third width.

11. The micro light-emitting diode structure as claimed in claim 1, wherein on the cross-section of the micro light-emitting diode structure, the first-type semiconductor layer has a first thickness, the base layer has a second thickness, and the light-emitting layer has a third thickness, and a sum of the first thickness and the third thickness is smaller than the second thickness.

12. The micro light-emitting diode structure as claimed in claim 2, wherein the carrier is without a circuit and further has an adhesive layer, and the micro light-emitting diode structure is disposed on the carrier through the adhesive layer.

13. A display panel device comprising:

a driving carrier; and a plurality of micro light-emitting diode structures electrically connected to and driven by the driving carrier, and each micro light-emitting diode structure comprising:

a first-type semiconductor layer having a first width on a cross-section of the micro light-emitting diode structure;

a second-type semiconductor layer disposed on a side of the first-type semiconductor layer and having a second width on the cross-section of the micro light-emitting diode structure;

a light-emitting layer disposed between the first-type semiconductor layer and the second-type semiconductor layer and having an extended part laterally protruding from at least two sides of the light-emitting layer relative to the first-type semiconductor layer and the second-type semiconductor layer, and the extended part exposes a part of an upper surface and a part of an underside surface of the light-emitting layer; and a third width greater than the first width and the second width on the cross-section of the micro light-emitting diode structure; and a base layer disposed on a side of the second-type semiconductor layer away from the first-type semiconductor layer and having a fourth width greater than the second width.

14. The display panel device as claimed in claim 13, wherein each base layer is a semiconductor layer and a side of each base layer away from the second-type semiconductor layer faces toward the driving carrier.

* * * * *